(12) United States Patent
Lee et al.

(10) Patent No.: US 9,000,428 B2
(45) Date of Patent: Apr. 7, 2015

(54) ORGANIC LIGHT EMITTING DIODE DISPLAY

(71) Applicant: Samsung Display Co., Ltd., Yongin, Gyeonggi-Do (KR)

(72) Inventors: Jae-Yong Lee, Yongin (KR); Won-Kyu Kwak, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 10 days.

(21) Appl. No.: 14/037,195

(22) Filed: Sep. 25, 2013

(65) Prior Publication Data
US 2014/0332769 A1 Nov. 13, 2014

(30) Foreign Application Priority Data
May 9, 2013 (KR) .................. 10-2013-0052586

(51) Int. Cl.
H01L 29/08 (2006.01)
H01L 35/24 (2006.01)
H01L 51/00 (2006.01)
H01L 27/32 (2006.01)

(52) U.S. Cl.
CPC .................. H01L 27/3272 (2013.01)

(58) Field of Classification Search
USPC .............. 257/40, 88, 99, 642–643, 759, 257/E51.001–E51.052, E25.008–E25.009, 257/66, 72, 223, 227, 291, 292, 439, 443, 257/655, E21.7, E27.1, E27.125, E27.112, 257/E29.117, E29.145, E29.147, E29.151, 257/E29.182, E29.202, E29.273–E29.299, 257/E29.314, E29.32, E23.016, E29.003, 257/E29.295, E21.094, E21.104, E21.121, 257/E21.372, E21.416; 438/29, 69, 82, 99, 438/28, 149, 163
See application file for complete search history.

(56) References Cited

U.S. PATENT DOCUMENTS

| 7,432,529 B2 * | 10/2008 | Yamazaki et al. .............. 257/72 |
| 8,742,446 B2 * | 6/2014 | Yamada et al. ................. 257/99 |
| 8,759,131 B2 * | 6/2014 | Yamazaki et al. ............. 438/34 |
| 8,841,658 B2 * | 9/2014 | Negishi et al. ................. 257/40 |
| 2003/0205763 A1 * | 11/2003 | Park et al. ..................... 257/359 |

FOREIGN PATENT DOCUMENTS

| KR | 10-0830331 B1 | 5/2008 |
| KR | 10-2008-0096321 A | 10/2008 |
| KR | 10-0875103 B1 | 12/2008 |

* cited by examiner

*Primary Examiner* — Dao H Nguyen
*Assistant Examiner* — Tram H Nguyen
(74) *Attorney, Agent, or Firm* — Knobbe Martens Olson & Bear, LLP (57) ABSTRACT

An organic light emitting diode (OLED) display with electrostatic discharges protection is disclosed. One inventive aspect includes a substrate including a pixel area and a peripheral area, an organic light emitting diode (OLED) formed at the pixel area, a driving circuit formed at the peripheral area, a shield layer formed with the same layer as the first electrode, and a first shield voltage line connected to the shield layer. The first shield voltage line transmits a shield voltage to the shield layer. The shield layer includes a plurality of sub-shield layers and covers the driving circuit to prevent an external electrostatic discharge.

19 Claims, 6 Drawing Sheets

ORGANIC LIGHT EMITTING DIODE DISPLAY

CROSS-REFERENCE TO RELATED APPLICATIONS

This application claims priority to and the benefit of Korean Patent Application No. 10-2013-0052586 filed in the Korean Intellectual Property Office on May 9, 2013, the entire contents of which are incorporated herein by reference.

BACKGROUND

1. Field

The disclosed technology relates to an organic light emitting diode (OLED) display, and more specifically to devices, systems, and methods related to the organic light emitting diode (OLED) display. More particularly, the disclosed technology relates to an organic light emitting diode display with electrostatic discharges protection.

2. Description of the Related Technology

An organic light emitting diode (OLED) display includes a substrate providing a pixel area, a peripheral area and a thin film encapsulation (TFE) layer encapsulating the substrate of the OLED display by alternately depositing an organic layer and an inorganic layer for encapsulation.

In the pixel area, OLEDs connected between a scan line and a data line in a matrix type are formed to include at least one pixel. The OLED includes an anode, a cathode, and an organic emission layer formed between the anode and the cathode. The peripheral area of OLED display includes a scan end, a data end, a power supply line for operation of the organic light emitting diode (OLED), a scan driver and a data driver. The scan end and the data end extend from the scan line and the data line. The scan driver and the data driver include a driving circuit converting the signals provided from the outside into the scan end and the data end of a scan signal and a data signal to select each pixel. The scan driver and the data driver is formed in a manufacturing process of the organic light emitting diode (OLED) or is manufactured into an additional integrated circuit chip (driver chip) and is mounted to the substrate.

In the organic light emitting diode (OLED) display, since the substrate is formed of a glass, electrostatic discharge (ESD) is frequently generated in the manufacturing process or usage. More particularly, because the driving circuit is formed at the peripheral area, the electrostatic discharge can easily flow in. Such that, the semiconductor layer and the gate insulating layer of the driving circuit can be damaged and erroneous operation or damage can be generated by a short between the gate electrode and the data line.

To protect the driving circuit from an electrostatic discharge, a shield layer is formed of the same material as an anode of the driving circuit is developed. The shield layer is connected to a common power source or a ground power source through a power supply line. However, because the shield layer is formed on the protective layer, the shield layer is easily expanded or contracted by heat. This stress can be transmitted to the thin film encapsulation layer such that the thin film encapsulation layer is easily damaged.

The above information disclosed in this Background section is only for enhancement of understanding of the background of the disclosed technology and therefore it may contain information that does not form the prior art that is already known in this country to a person of ordinary skill in the art.

SUMMARY OF CERTAIN INVENTIVE ASPECTS

The disclosed technology relates to an organic light emitting diode (OLED) display that prevents damage to a thin film encapsulation layer from heat expansion and contraction of a shield layer.

An organic light emitting diode (OLED) display according to an exemplary embodiment of the disclosed technology includes: a substrate including a pixel area and a peripheral area, an organic light emitting diode (OLED) formed at the pixel area, a driving circuit formed at the peripheral area and driving the organic light emitting diode (OLED), a shield layer formed with the same layer as a first electrode, and a first shield voltage line connected to the shield layer and transmitting a shield voltage to the shield layer. The peripheral area encloses the pixel area. The organic light emitting diode (OLED) includes a first electrode, an organic emission layer, and a second electrode. The shield layer includes a plurality of sub-shield layers and covers the driving circuit to prevent an external electrostatic discharge.

In another exemplary implementation of the organic light emitting diode (OLED) display, the first shield voltage line may be connected to one end of each of the plurality of sub-shield layers.

In another exemplary implementation of the organic light emitting diode (OLED) display, a second shield voltage line is connected to the other end of the each of the plurality of sub-shield layers.

In another exemplary implementation of the organic light emitting diode (OLED) display, the first shield voltage line is formed on an edge of the peripheral area and has a guard ring shape.

In another exemplary implementation of the organic light emitting diode (OLED) display, a surrounding semiconductor layer formed at the peripheral area on the substrate, a gate insulating layer formed on the surrounding semiconductor layer, a surrounding gate electrode formed on the gate insulating layer, an interlayer insulating layer formed on the surrounding gate electrode, a surrounding source electrode and a surrounding drain electrode formed on the interlayer insulating layer, a first shield voltage line formed on the interlayer insulating layer, and a protective layer. The surrounding source electrode and the surrounding drain electrode are connected to the surrounding semiconductor layer through a contact hole formed at the interlayer insulating layer. The protective layer covers the surrounding source electrode, the surrounding drain electrode and the first shield voltage line. The shield layer and the first electrode are formed on the protective layer.

In another exemplary implementation of the organic light emitting diode (OLED) display, a second shield voltage line is formed on the interlayer insulating layer.

In another exemplary implementation of the organic light emitting diode (OLED) display, the first shield voltage line and the second shield voltage line are connected to a common power source or a ground power source.

In another exemplary implementation of the organic light emitting diode (OLED) display, the organic light emitting diode (OLED) display according to an exemplary embodiment, the shield layer is divided into a plurality of sub-shield layers such that the stress by the heat expansion and contraction of the shield layer is reduced. Therefore, a crack of the thin film encapsulation layer is prevented.

In another exemplary implementation of the organic light emitting diode (OLED) display, by forming the first shield voltage line and the second shield voltage line connected to both ends of the shield layer, the stress by the heat expansion and contraction of the shield layer is reduced. Therefore, a crack of the thin film encapsulation layer is prevented.

In another exemplary implementation of the organic light emitting diode (OLED) display, the second shield voltage line connects to the other end of the each of the plurality of sub-shield layers through at least one contact hole formed in the protective layer.

In another exemplary implementation of the organic light emitting diode (OLED) display, the protective layer further includes at least one via hole exposing a predetermined portion of the surrounding source electrode, the surrounding drain electrode and the first shield voltage line.

In another exemplary implementation of the organic light emitting diode (OLED) display, the shield layer further comprises a plurality of holes.

In another exemplary implementation of the organic light emitting diode (OLED) display, a buffer layer is formed on at least one of the pixel area and the peripheral area.

In another exemplary implementation of the organic light emitting diode (OLED) display, a pixel definition layer is formed on the pixel area and the pixel definition layer includes an opening exposing a portion of the first electrode.

In another exemplary implementation of the organic light emitting diode (OLED) display, the shield layer is formed of a material same as an anode of the driving circuit.

In another exemplary implementation of the organic light emitting diode (OLED) display, the first electrode further includes at least one of a red first electrode, a green first electrode and a blue first electrode.

In another exemplary implementation of the organic light emitting diode (OLED) display, at least one driving thin film transistor is formed in the pixel area. The at least one driving thin film transistor further comprises a pixel semiconductor layer, a pixel source electrode, a pixel drain electrode connected to a source region and a drain region and a pixel gate electrode formed on a channel region. The pixel source electrode includes the source region, the drain region and the channel region. The pixel gate electrode is insulted from the pixel semiconductor layer.

In another exemplary implementation of the organic light emitting diode (OLED) display, the pixel gate electrode is insulted from the pixel semiconductor layer by a gate insulating layer formed in the peripheral area.

An organic light emitting diode (OLED) display according to an exemplary embodiment of the disclosed technology includes: a substrate including a pixel area and a peripheral area, an organic light emitting diode (OLED) formed at the pixel area, a driving circuit formed at the peripheral area and driving the organic light emitting diode (OLED), a shield layer formed with the same layer as a first electrode, and a first shield voltage line connected to the shield layer and transmitting a shield voltage to the shield layer. The peripheral area encloses the pixel area. The organic light emitting diode (OLED) includes a first electrode, an organic emission layer, and a second electrode. The shield layer includes a plurality of sub-shield layers and a plurality of holes. The shield layer covers the driving circuit to prevent an external electrostatic discharge.

In another exemplary implementation of the organic light emitting diode (OLED) display, the shield layer is formed of a material same as an anode of the driving circuit.

In another exemplary implementation of the organic light emitting diode (OLED) display, at least one driving thin film transistor is formed in the pixel area. The at least one driving thin film transistor further comprises a pixel semiconductor layer, a pixel source electrode, a pixel drain electrode connected to a source region and a drain region and a pixel gate electrode formed on a channel region. The pixel source electrode includes the source region, the drain region and the channel region. The pixel gate electrode is insulted from the pixel semiconductor layer.

DETAILED DESCRIPTION OF CERTAIN INVENTIVE EMBODIMENTS

The disclosed technology will be described more fully hereinafter with reference to accompanying drawings, in which exemplary embodiments are shown. As those skilled in the art would realize, the described embodiments may be modified in various different ways, all without departing from the spirit or scope of the disclosed technology.

In order to describe the disclosed technology more clearly, parts that are not related to the description will be omitted from the drawings, and the same symbols will be given to similar parts throughout the specification.

Furthermore, as the size and thickness of the respective structural components shown in the drawings are arbitrarily illustrated for explanatory convenience, the disclosed technology is not necessarily limited to as illustrated.

In the drawings, the thickness of layers, films, panels, regions, etc., are exaggerated for clarity. In the drawings, for understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. In addition, in the specification, the word "on" means positioning on or below the object portion, but does not essentially mean positioning on the upper side of the object portion based on a gravity direction.

Further, in the specification, the phrase "on a flat surface" means when an object portion is viewed from the above, and the phrase "on a cross-section" means when a cross-section taken by vertically cutting an object portion is viewed from the side. Here, when a first element is described as being coupled to a second element, the first element may be not only directly coupled to the second element but may also be indirectly coupled to the second element via a third element. Further, some of the elements that are not essential to the complete understanding of the disclosed technology are omitted for clarity. Also, like reference numerals refer to like elements throughout.

In addition, in the accompanying drawings, an organic light emitting diode (OLED) display is illustrated as an active matrix (AM)-type OLED display in a 6Tr-1Cap structure in which six thin film transistors (TFTs) and one capacitor are formed in one pixel, but the disclosed technology is not limited thereto. Therefore, the OLED display may have various structures. For example, a plurality of TFTs and at least one capacitor may be provided in one pixel of the OLED display, and separate wires may be further provided in the OLED display. Here, the pixel refers to a minimum unit for displaying an image, and the OLED display displays an image by using a plurality of pixels.

Now, an organic light emitting diode (OLED) display according to the first exemplary embodiment will be described with reference to FIG. 1 to FIG. 3.

Figure 1:
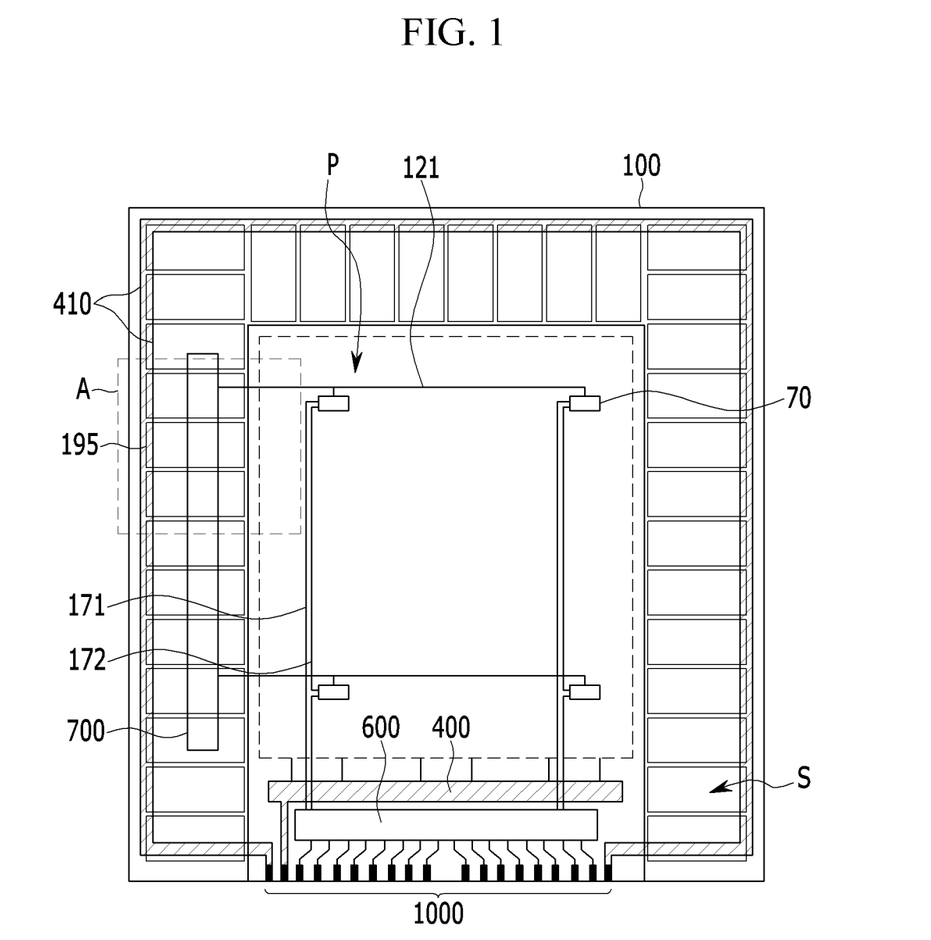
FIG. 1 is a top plan view of a pixel area and a peripheral area of an organic light emitting diode (OLED) display according to a first exemplary embodiment.
Figure 2:
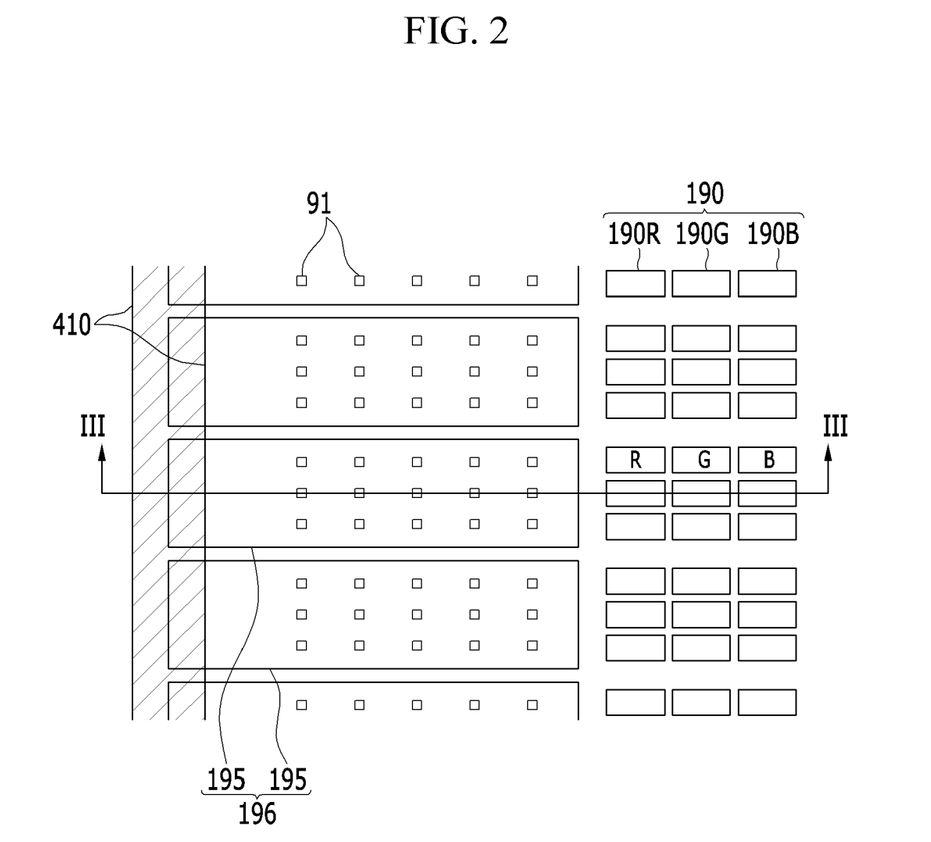
FIG. 2 is an enlarged top plan view of a portion A of FIG. 1.
Figure 3:
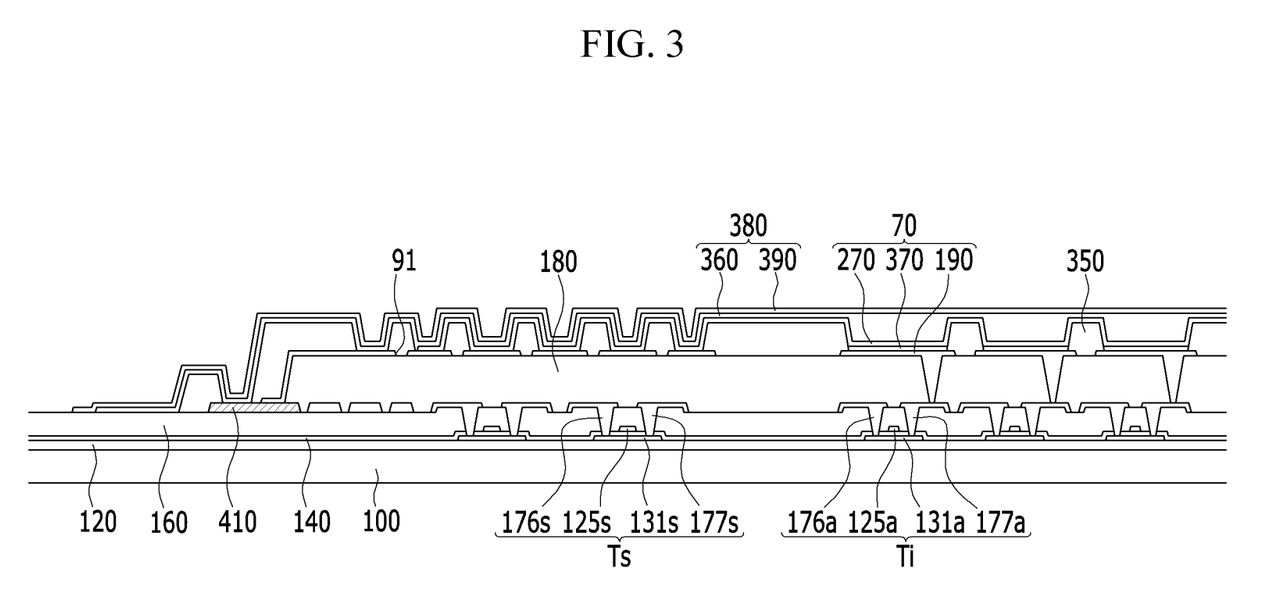
FIG. 3 is a cross-sectional view taken along the line of FIG. 2.

FIG. 1 is a top plan view of a pixel area and a peripheral area of an organic light emitting diode (OLED) display according to the first exemplary embodiment, FIG. 2 is an enlarged top plan view of a portion A of FIG. 1, and FIG. 3 is a cross-sectional view taken along the line of FIG. 2.

As shown in FIG. 1 to FIG. 3, a substrate 100 of an organic light emitting diode (OLED) display according to the first exemplary embodiment is divided into a pixel area P and a peripheral area S. The peripheral area S encloses the pixel area P.

In the pixel area P of the substrate 100, a plurality of organic light emitting diodes (OLED) 70 are formed and connected in a matrix type between a scan line 121, a data line 171 and a driving voltage line 172. The scan line 121 transmits a scan signal. The data line 171 transmits a data signal. The driving voltage line 172 transmits a driving voltage. The organic light emitting diode (OLED) 70 includes a first electrode 190, a second electrode 270 and an organic emission layer 370. The organic emission layer 370 is formed between the first electrode 190 and the second electrode 270. In addition, the organic emission layer 370 is formed with a structure including a hole transport layer (HTL), an organic emission layer, and an electron transport layer (ETL), and a hole injection layer (HIL) and an electron injection layer (EIL) may be further included.

In the pixel area P of the substrate 100, a thin film transistor to control an operation of the organic light emitting diode (OLED) 70 and a capacitor to maintain an applied signal are further formed. The thin film transistor includes a switching thin film transistor (not shown) and a driving thin film transistor T1. The driving thin film transistor T1 is connected to the first electrode 190. The driving thin film transistor T1 includes a pixel semiconductor layer 131a, a pixel source electrode 176a, a pixel drain electrode 177a and a pixel gate electrode 125a. The pixel semiconductor layer 131a provides a source region, a drain region and a channel region. The source region and the drain region are connected to the pixel source electrode 176a and the pixel drain electrode 177a. The pixel gate electrode 125a is formed on the channel region and is insulated from the pixel semiconductor layer 131a by the gate insulating layer 140.

In the peripheral area S of the substrate 100, a power supply line 400 to operate the organic light emitting diode (OLED) 70, a first shield voltage line 410 for an electrostatic discharge shield, and a scan driver 700 and a data driver 600 are formed. The data driver 600 processes the signal provided from the outside through a pad 1000 and respectively supplies them to the scan line 121 and the data line 171.

The scan driver 700 and the data driver 600 convert a signal provided from the outside through the pad 1000 into the scan signal and the data signal to selectively drive each pixel. The scan driver 700 and the data driver 600 respectively include a driving circuit having a plurality of surrounding thin film transistors Ts.

The surrounding thin film transistors Ts include a surrounding semiconductor layer 131s, a surrounding gate electrode 125s, a surrounding source electrode 176s and a surrounding drain electrode 177s. The surrounding source electrode 176s and the surrounding drain electrode 177s face each other with reference to the surrounding gate electrode 125s on a plane.

In one implementation of the peripheral area S of the substrate 100, a shield layer 196 is formed and prevents external electrostatic discharge from flowing into the driving circuit. The shield layer 196 includes a plurality of gas holes 91 to discharge an inner gas. The shield layer 196 is divided into a plurality of sub-shield layers 195. As described above, since the shield layer 196 is divided into the plurality of sub-shield layers 195, stress caused by heat expansion and contraction of the shield layer 196 is smooth such that a crack of the thin film encapsulation layer may be prevented.

The shield layer 196 is connected to the first shield voltage line 410 transmitting a common power source or a ground power source. The first shield voltage line 410 is connected to one end of the sub-shield layer 195. The first shield voltage line 410 may have a guard ring formed on an edge of the peripheral area. As described above, the shield layer 196 is connected to the common power source or the ground power source (not shown) through the first shield voltage line 410 such that the driving circuit may be effectively protected from the electrostatic discharge flowing in through the peripheral area S.

Meanwhile, on the organic light emitting diode (OLED) 70, a thin film encapsulation layer 380 is formed with a multi-layered structure of an encapsulation organic layer 360 and an encapsulation inorganic layer 390. A flexible printed circuit (FPC) (not shown) of a film shape is electrically connected to the pad 1000 of the organic light emitting diode (OLED) display. Driving power source voltages (ELVDD and ELVSS) and a data signal etc., are input therethrough. If a signal is input to the power supply line 400, the first shield voltage line 410, the scan driver 700 and the data driver 600 through the pad 1000, the scan driver 700 and the data driver 600 respectively supply a scan signal and a data signal to the scan line 121 and the data line 171. Accordingly, the organic light emitting diode (OLED) 70 of the pixel selected by the scan signal emits light corresponding to the data signal.

In the next, a layered structure of an organic light emitting diode (OLED) display according to the first exemplary embodiment will be described with reference to FIG. 1 to FIG. 3.

As shown in FIG. 1 to FIG. 3, in the organic light emitting diode (OLED) display according to the first exemplary embodiment, a buffer layer 120 is formed on the pixel area P and the peripheral area S of the substrate 100. The pixel semiconductor layer 131a and the surrounding semiconductor layer 131s are formed on the buffer layer 120. The pixel semiconductor layer 131a is formed at the pixel area P and provides an active layer of a driving thin film transistor T1 to drive the organic light emitting diode (OLED) 70. The surrounding semiconductor layer 131s is formed at the peripheral area S and provides an active layer of the surrounding thin film transistor Ts consisting of the driving circuit.

The gate insulating layer 140 is formed on the entire pixel area P and peripheral area S. The entire pixel area P and peripheral area S include the pixel semiconductor layer 131a and the surrounding semiconductor layer 131s. The pixel gate electrode 125a and the surrounding gate electrode 125s are formed on the gate insulating layer 140 of the pixel semiconductor layer 131a and the surrounding semiconductor layer 131s. In one implementation, the scan line 121 is connected to the pixel gate electrode 125a and formed at the pixel area P, and a scan line 121 extended from the scan line 121 of the pixel area P and the pad 1000 to receive the signal from the outside are formed at the peripheral area S.

An interlayer insulating layer 160 is formed on the entire pixel area P and peripheral area S. The entire pixel area P and peripheral area S include the pixel gate electrode 125a and the surrounding gate electrode 125s. The interlayer insulating layer 160 and the gate insulating layer 140 have contact holes exposing a predetermined portion of the pixel semiconductor layer 131 a and the surrounding semiconductor layer 131s. Pixel source and drain electrodes 176a and 177a and surrounding source and drain electrodes 176s and 177s are formed and connected to the pixel semiconductor layer 131a and the surrounding semiconductor layer 131 through the contact holes. The data line 171 is connected to the pixel source and drain electrodes 176a and 177a and is formed at the pixel area P. A data line 171 is formed at the peripheral area S and is extended from the data line 171 of the pixel area P, the power supply line 400, the first shield voltage line 410 and a pad 1000 to receive a signal from the outside e.

A protective layer 180 is formed on the entire pixel area P and peripheral area S. A via hole is formed at the protective layer 180 of the pixel area P and exposes a predetermined portion of the pixel drain electrode 177a. Via holes are formed at the protective layer 180 of the peripheral area S and expose predetermined portions of the power supply line 400 and the first shield voltage line 410. The first electrode 190 is formed at the pixel area P and us connected to the pixel drain electrode 177a through the via hole. The shield layer 196 is formed at the peripheral area S. The first electrode 190 includes a red first electrode 190R, a green first electrode 190G, and a blue first electrode 190B. The red first electrode 190R, the green first electrode 190G and the blue first electrode 190B are formed in the red pixel, the green pixel, and the blue pixel, respectively. The shield layer 196 is formed at the peripheral area S including the driving circuit and is connected to the first shield voltage line 410 through the via hole.

A pixel definition layer 350 is formed on the entire pixel area P. and the pixel definition layer 350 has an opening exposing a portion (a light emitting region) of the first electrode 190. The organic emission layer 370 is formed on an exposed anode 109. The second electrode 270 is formed at the pixel area P including the organic emission layer 370 and is connected to the power supply line 400.

Figure 4:
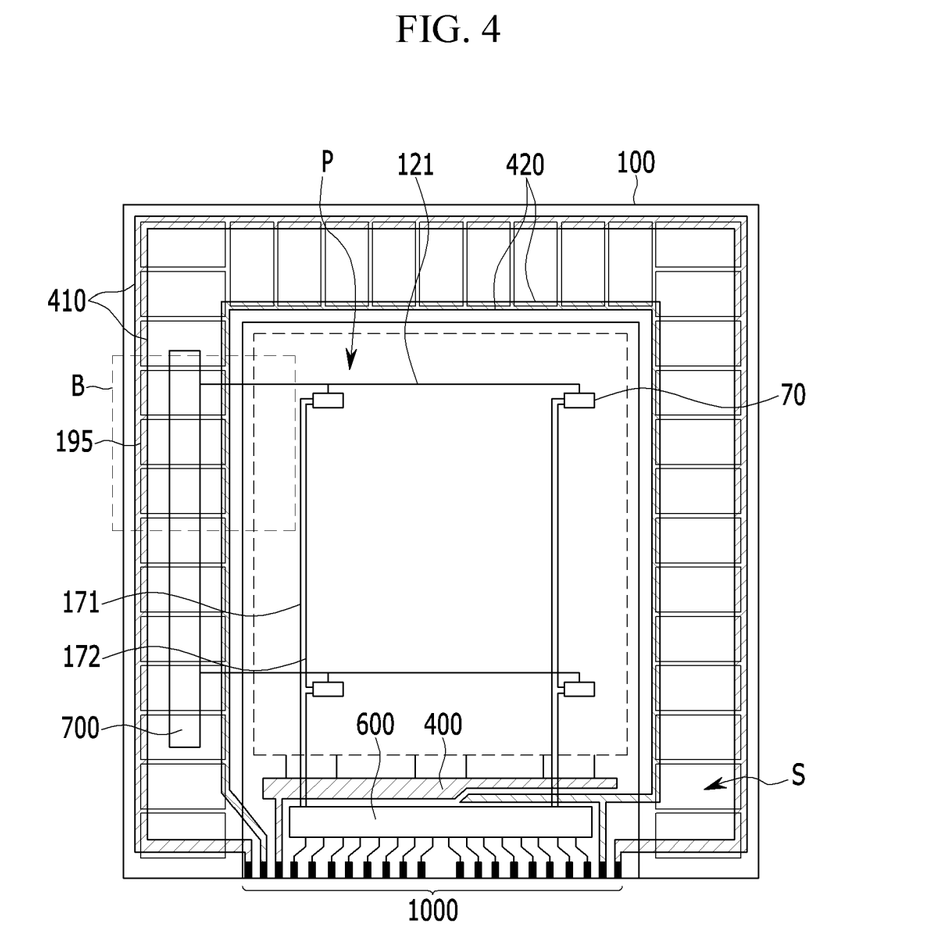
FIG. 4 is a top plan view of a pixel area and a peripheral area of an organic light emitting diode (OLED) display according to a second exemplary embodiment.
Figure 5:
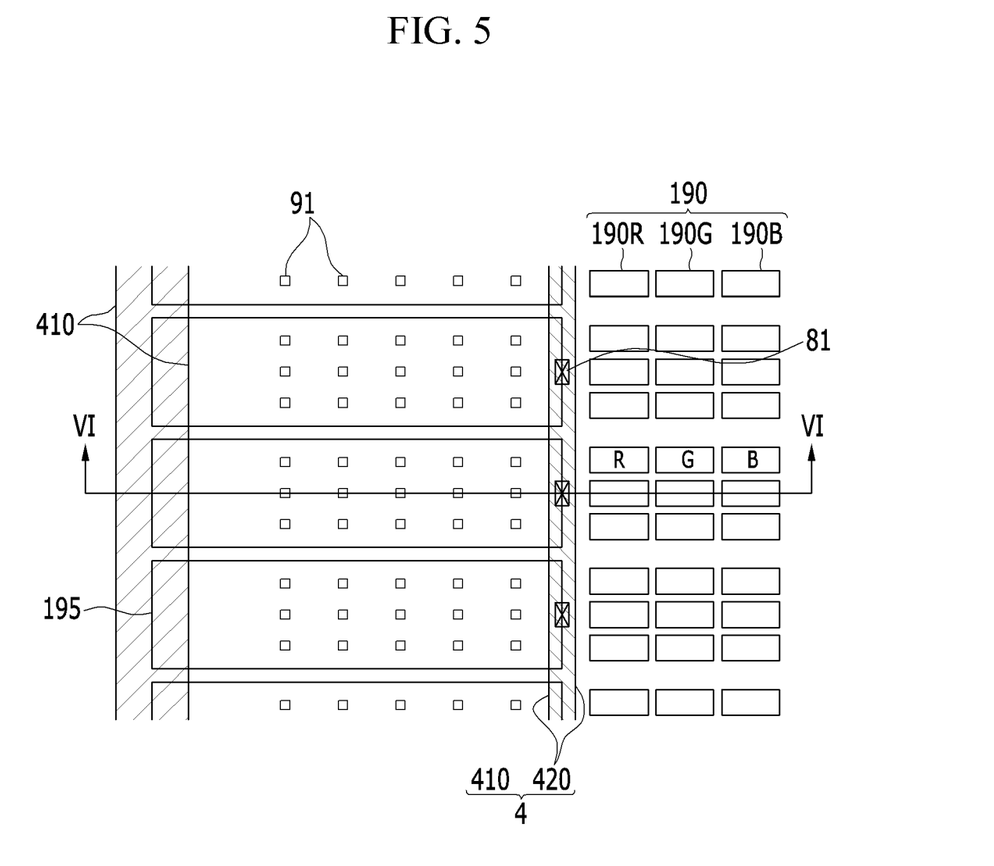
FIG. 5 is an enlarged top plan view of a portion B of FIG. 4.
Figure 6:
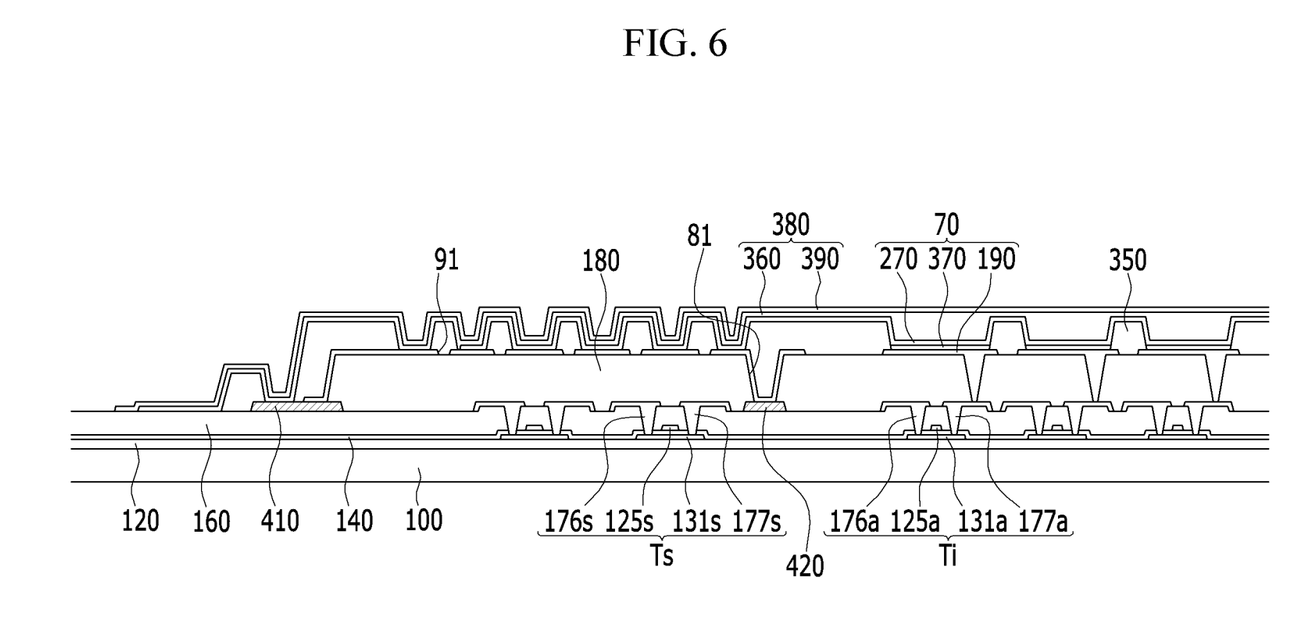
FIG. 6 is a cross-sectional view taken along the line VI-VI of FIG. 5.

FIG. 4 is a top plan view of a pixel area and a peripheral area of an organic light emitting diode (OLED) display according to the second exemplary embodiment, FIG. 5 is an enlarged top plan view of a portion B of FIG. 4, and FIG. 6 is a cross-sectional view taken along the line VI-VI of FIG. 5.

The second exemplary embodiment shown in FIG. 4 to FIG. 6 is substantially equivalent to the first exemplary embodiment shown in FIG. 1 to FIG. 3 except for a second shield voltage line that is added such that the overlapping description is omitted.

As shown in FIG. 4 to FIG. 6, at the peripheral area S of the substrate 100 of the organic light emitting diode (OLED) display according to the second exemplary embodiment, the shield layer 196 preventing the external electrostatic discharge from flowing into the driving circuit is formed. The shield layer 196 is divided into a plurality of sub-shield layers 195. As described above, since the shield layer 196 is divided into a plurality of sub-shield layers 195, stress caused by the heat expansion and contraction of the shield layer 196 is reduced thereby preventing the crack of the thin film encapsulation layer.

The shield layer 196 is connected to a shield voltage line 4 including the first shield voltage line 410 and a second shield voltage line 420 transmitting the common power source or the ground power source, the first shield voltage line 410 is connected to one end of the sub-shield layer 195. The second shield voltage line 420 is connected to the other end of the sub-shield layer 195 through a contact hole 81 formed in the protective layer 180. As described above, since the shield layer 196 is connected to the common power source or the ground power source (not shown) through the first shield voltage line 410 and the second shield voltage line 420, the driving circuit may be further effectively protected from the electrostatic discharge flowing in through the peripheral area S.

While this disclosed technology has been described in connection with what is presently considered to be practical exemplary embodiments, it is to be understood that the disclosed technology is not limited to the disclosed embodiments, but, on the contrary, is intended to cover various modifications and equivalent arrangements included within the spirit and scope of the appended claims.

For purposes of summarizing the disclosed technology, certain aspects, advantages and novel features of the disclosed technology have been described herein. It is to be understood that not necessarily all such advantages may be achieved in accordance with any particular embodiment of the disclosed technology. Thus, the disclosed technology may be embodied or carried out in a manner that achieves or optimizes one advantage or group of advantages as taught herein without necessarily achieving other advantages as may be taught or suggested herein.

A detailed description of the accompanying drawings and the disclosed technology are only an embodiment, which are used for the purpose of describing the disclosed technology but are not used to limit the meanings or a range of the disclosed technology described in claims. Accordingly, those skilled in the art to which the disclosed technology pertains can easily select and substitute therefrom. Therefore, a substantial technical protective range of the disclosed technology will be determined based on a technical idea of appended claims.

What is claimed is:

1. An organic light emitting diode (OLED) display comprising:
    a substrate including a pixel area and a peripheral area, the peripheral area enclosing the pixel area;
    an OLED formed at the pixel area and including a first electrode, an organic emission layer and a second electrode;
    a driving circuit formed at the peripheral area and configured to drive the OLED;
    a shield layer formed with the same layer as the first electrode and covering the driving circuit, the shield layer including a plurality of sub-shield layers; and
    a first shield voltage line connected to the shield layer and transmitting a shield voltage to the shield layer.

2. The display of claim 1, wherein the first shield voltage line is connected to one end of each of the sub-shield layers.

3. The display of claim 2, further comprising a second shield voltage line connected to the other end of the each of the sub-shield layers.

4. The display of claim 3, wherein the first shield voltage line is formed on an edge of the peripheral area and has a guard ring shape.

5. The display of claim 4, further comprising:
a surrounding semiconductor layer formed at the peripheral area on the substrate;
a gate insulating layer formed on the surrounding semiconductor layer;
a surrounding gate electrode formed on the gate insulating layer;
an interlayer insulating layer formed on the surrounding gate electrode;
a surrounding source electrode and a surrounding drain electrode formed on the interlayer insulating layer and connected to the surrounding semiconductor layer through a contact hole formed at the interlayer insulating layer;
a first shield voltage line formed on the interlayer insulating layer; and
a protective layer covering the surrounding source electrode, the surrounding drain electrode and the first shield voltage line,
wherein the shield layer and the first electrode are formed on the protective layer.

6. The display of claim 5, further comprising a second shield voltage line formed on the interlayer insulating layer.

7. The display of claim 6, wherein the first shield voltage line and the second shield voltage line are connected to a common power source or a ground power source.

8. The display of claim 5, wherein the second shield voltage line connects to the other end of the each of the plurality of sub-shield layers through at least one contact hole formed in the protective layer.

9. The display of claim 5, wherein the protective layer further includes at least one via hole exposing a predetermined portion of the surrounding source electrode, the surrounding drain electrode and the first shield voltage line.

10. The display of claim 1, wherein the shield layer further comprises a plurality of holes.

11. The display of claim 1, further comprising a buffer layer formed on at least one of the pixel area and the peripheral area.

12. The display of claim 1, further comprising a pixel definition layer formed on the pixel area, the pixel definition layer including an opening exposing a portion of the first electrode.

13. The display of claim 1, wherein the shield layer is formed of the same material as that for an anode of the driving circuit.

14. The display of claim 1, wherein the first electrode further includes at least one of a red first electrode, a green first electrode and a blue first electrode.

15. The display of claim 1, further comprising at least one driving thin film transistor formed in the pixel area, the at least one driving thin film transistor further comprising:
a pixel semiconductor layer;
a pixel source electrode including a source region, a drain region and a channel region;
a pixel drain electrode connected to the source region and the drain region; and
a pixel gate electrode formed on the channel region and insulted from the pixel semiconductor layer.

16. The display of claim 15, wherein the pixel gate electrode is insulted from the pixel semiconductor layer by a gate insulating layer formed in the peripheral area.

17. An organic light emitting diode (OLED) display comprising:
a substrate including a pixel area and a peripheral area, the peripheral area enclosing the pixel area;
an OLED formed at the pixel area and including a first electrode, an organic emission layer and a second electrode;
a driving circuit formed at the peripheral area and configured to drive the OLED; and
a shield layer formed with the same layer as the first electrode and covering the driving circuit, the shield layer including a plurality of sub-shield layers and a plurality of holes.

18. The display of claim 17, wherein the shield layer is formed of the same material as that for an anode of the driving circuit.

19. The display of claim 17, further comprising at least one driving thin film transistor formed in the pixel area, the at least one driving thin film transistor further comprising:
a pixel semiconductor layer;
a pixel source electrode including a source region, a drain region and a channel region;
a pixel drain electrode connected to the source region and the drain region; and
a pixel gate electrode formed on the channel region and insulted from the pixel semiconductor layer.

* * * * *